(12) United States Patent
Miyano et al.

(10) Patent No.: US 8,917,563 B2
(45) Date of Patent: Dec. 23, 2014

(54) SEMICONDUCTOR DEVICE AND INFORMATION PROCESSING SYSTEM INCLUDING AN INPUT CIRCUIT WITH A DELAY

(75) Inventors: Kazutaka Miyano, Tokyo (JP); Hiroyuki Inage, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 243 days.

(21) Appl. No.: 13/317,597

(22) Filed: Oct. 24, 2011

(65) Prior Publication Data

US 2012/0120745 A1    May 17, 2012

(30) Foreign Application Priority Data

Nov. 11, 2010 (JP) ................................. 2010-252678

(51) Int. Cl.
| | | |
|---|---|---|
| *G11C 7/00* | (2006.01) | |
| *G11C 7/10* | (2006.01) | |
| *G11C 7/22* | (2006.01) | |
| *G11C 29/02* | (2006.01) | |
| *G11C 11/4076* | (2006.01) | |
| *G11C 11/4096* | (2006.01) | |
| *G11C 7/02* | (2006.01) | |

(52) U.S. Cl.
CPC ............ *G11C 29/023* (2013.01); *G11C 7/1045* (2013.01); *G11C 7/1012* (2013.01); *G11C 7/222* (2013.01); *G11C 29/022* (2013.01); *G11C 11/4076* (2013.01); *G11C 11/4096* (2013.01); *G11C 7/1072* (2013.01); *G11C 29/028* (2013.01); *G11C 7/02* (2013.01)
USPC ............................ 365/194; 365/191; 365/226

(58) Field of Classification Search
USPC ........................................ 365/191, 194, 226
See application file for complete search history.

(56) References Cited

U.S. PATENT DOCUMENTS

| | | | |
|---|---|---|---|
| 5,712,586 A | 1/1998 | Kitao | |
| 6,023,175 A | 2/2000 | Nunomiya et al. | |
| 7,233,540 B1 * | 6/2007 | Vinke et al. ............... | 365/230.01 |
| 7,817,484 B2 * | 10/2010 | Demone ........................ | 365/194 |
| 7,898,900 B2 | 3/2011 | Fujisawa | |
| 8,174,910 B2 | 5/2012 | Sato | |
| 8,243,534 B2 | 8/2012 | Fujisawa | |

FOREIGN PATENT DOCUMENTS

| | | |
|---|---|---|
| JP | H05-315939 A | 11/1993 |
| JP | H5-335499 A | 12/1993 |
| JP | H5-342846 A | 12/1993 |
| JP | H9-8632 A | 1/1997 |
| JP | 09-186579 A | 7/1997 |
| JP | H9-246473 A | 9/1997 |
| JP | H10-135815 A | 5/1998 |
| JP | H11-88146 A | 3/1999 |
| JP | H11-94914 A | 4/1999 |

(Continued)

*Primary Examiner* — Vanthu Nguyen
(74) *Attorney, Agent, or Firm* — McGinn IP Law Group, PLLC

(57) ABSTRACT

A semiconductor device includes: an input node supplied with an input signal; an output node provided correspondingly to the input node; first and second input circuits coupled in parallel to each other between the input and output nodes; and a control circuit configured to control the first and second input circuits such that one of the first and second input circuits is switched over from an active state to an inactive state and the other of the first and second input circuits is switched over from an inactive state to an active state during the one of the first and second input circuits being still in the active state.

19 Claims, 12 Drawing Sheets

(56) References Cited

FOREIGN PATENT DOCUMENTS

| JP | 2001-094410 A | 4/2001 |
| JP | 2009-277305 A | 11/2009 |
| JP | 2010-147928 A | 7/2010 |
| JP | 2010-192031 A | 9/2010 |

* cited by examiner

| TIME | T 1 | T 2 | T 3 | T 4 | T 5 | T 6 |
|---|---|---|---|---|---|---|
| COMMAND | POWER-ON + RESET COMMAND | MR1 (SECOND COMMAND; WRITE LEVELING) | MR0 (THIRD COMMAND; DLL ADJUSTMENT) | MR2 (FIRST COMMAND; CAS WRITE LATENCY CWL) | ACTIVE COMMAND | MR2 (FIRST COMMAND; CAS WRITE LATENCY CWL) |
| ADD/CMD INPUT CIRCUIT | 1 0 0 A | 1 0 0 A | 1 0 0 A | 1 0 0 B | 1 0 0 B | 1 0 0 A |
| DQ/DQS INPUT CIRCUIT | 1 0 0 A | 1 0 0 A | 1 0 0 A | 1 0 0 A | 1 0 0 A | 1 0 0 A |
| CK INPUT CIRCUIT | 1 0 0 A | 1 0 0 A | 1 0 0 A | 1 0 0 A | 1 0 0 A | 1 0 0 A |

FIG.9

| TIME | T 1 | T 2 | T 3 | T 4 | T 5 | T 6 |
|---|---|---|---|---|---|---|
| COMMAND | POWER-ON + RESET COMMAND | MR0 (THIRD COMMAND; DLL ADJUSTMENT) | MR2 (FIRST COMMAND; CAS WRITE LATENCY CWL) | MR1 (SECOND COMMAND; WRITE LEVELING) | ACTIVE COMMAND | RESET |
| ADD/CMD INPUT CIRCUIT | 100A | 100A | 100B | 100B | 100B | 100A |
| DQ/DQS INPUT CIRCUIT | 100A | 100A | 100B | 100B | 100B | 100A |
| CK INPUT CIRCUIT | 100A | 100A | 100A | 100A | 100A | 100A |

FIG.10

| TIME | T 1 | T 2 | T 3 | T 4 | T 5 |
|---|---|---|---|---|---|
| COMMAND | POWER-ON + RESET COMMAND | MR2 (FIRST COMMAND; CAS WRITE LATENCY CWL) | MR0 (THIRD COMMAND; DLL ADJUSTMENT) | MR1 (SECOND COMMAND; WRITE LEVELING) | ACTIVE COMMAND |
| ADD/CMD INPUT CIRCUIT | 1 0 0 A | 1 0 0 B | 1 0 0 B | 1 0 0 B | 1 0 0 B |
| DQ/DQS INPUT CIRCUIT | 1 0 0 A | 1 0 0 B | 1 0 0 B | 1 0 0 B | 1 0 0 B |
| CK INPUT CIRCUIT | 1 0 0 A | 1 0 0 B | 1 0 0 B | 1 0 0 B | 1 0 0 B |

FIG.11

| TIME | T 1 | T 2 | T 3 | T 4 | T 5 |
|---|---|---|---|---|---|
| COMMAND | POWER-ON + RESET COMMAND | MR2 (FIRST COMMAND; CAS WRITE LATENCY CWL) | MR0 (THIRD COMMAND; DLL ADJUSTMENT) | MR1 (SECOND COMMAND; WRITE LEVELING) | ACTIVE COMMAND |
| ADD/CMD INPUT CIRCUIT | 1 0 0 B | 1 0 0 A | 1 0 0 A | 1 0 0 A | 1 0 0 A |
| DQ/DQS INPUT CIRCUIT | 1 0 0 B | 1 0 0 A | 1 0 0 A | 1 0 0 A | 1 0 0 A |
| CK INPUT CIRCUIT | 1 0 0 B | 1 0 0 A | 1 0 0 A | 1 0 0 A | 1 0 0 A |

FIG.12

SEMICONDUCTOR DEVICE AND INFORMATION PROCESSING SYSTEM INCLUDING AN INPUT CIRCUIT WITH A DELAY

BACKGROUND OF THE INVENTION

1. Field of the Invention

The present invention relates to a semiconductor device and an information processing system including the same, and more particularly to a semiconductor device that can change the characteristics of input circuits and an information processing system including the same.

2. Description of Related Art

Semiconductor devices such as a dynamic random access memory (DRAM) have input circuits for accepting various types of input signals supplied from outside, such as address signals, command signals, and write data. In general, there is a tradeoff between the operating speed and power consumption of an input circuit. Input circuits having a high operating speed characteristic are high in power consumption. Input circuits with a low power consumption characteristic are low in operating speed. Input circuits that satisfy both speed and power consumption need to be provided based on the operating frequency the semiconductor device needs. For example, in a semiconductor device of variable operating speed (operating frequency), input circuits need to be designed for the highest possible operating speed. In such a case, there is the problem that the input circuits have excessively high power consumption if the actual setting of the operating speed is low.

To solve such a problem, as discussed in Japanese Patent Application Laid-Open Nos. 2001-94410 and H09-186579, a plurality of input circuits having different characteristics may be connected in parallel so that any one of the input circuits can be selected depending on the characteristic needed.

Switching the input circuit to use among a plurality of input circuits connected in parallel may produce noise or hazard in the output signal from the input circuits. Such noise or hazard can cause subsequent circuits to error. This problem will not occur from a method in which one of a plurality of input circuits is selected before power-on, or typically in the manufacturing phase in advance. The foregoing noise problem is inevitable, however, in a method in which one of a plurality of input circuits can be selected in real time after power-on. For example, a controller for controlling the semiconductor device issues a mode register setting command to the semiconductor device to select the operating frequency of the semiconductor device after the semiconductor device is powered on or after hardware reset. In DRAM, the setting of a CAS write latency, which indicates the latency from the reception of an access command to a memory cell to the input of data, indirectly specifies the operating frequency of the semiconductor device. The smaller the value of the CAS write latency, the lower the operating frequency between the memory controller and the DRAM. The greater the value of the CAS write latency, the higher the operating frequency.

SUMMARY

In one embodiment, there is provided a semiconductor device that includes: an input node supplied with an input signal; an output node provided correspondingly to the input node; first and second input circuits coupled in parallel to each other between the input and output nodes; and a control circuit configured to control the first and second input circuits such that one of the first and second input circuits is switched over from an active state to an inactive state and the other of the first and second input circuits is switched over from an inactive state to an active state during the one of the first and second input circuits being still in the active state.

In another embodiment, there is provided a semiconductor device that includes: an input node; an output node; first and second input circuits connected in parallel between the input node and the output node, the first and second input circuits having mutually different electrical characteristics; and a control circuit selecting one of the first and second input circuits based on a switch signal, wherein the control circuit changes one of the first and second input circuits in an inactive state to an active state at a first timing in response to a transition of the switch signal, and the control circuit changes other of the first and second input circuits in the active state to the inactive state at a second timing later than the first timing in response to the transition of the switch signal.

In one embodiment, there is provided an information processing system that includes the foregoing semiconductor device and a controller that controls the semiconductor device.

BRIEF DESCRIPTION OF THE DRAWINGS

The above and other features and advantages of the present invention will be more apparent from the following description of certain preferred embodiments taken in conjunction with the accompanying drawings, in which:

FIG. 9 is a chart showing a first pattern of relationship between a memory controller 420 and semiconductor devices 10 in the information processing system according to an embodiment of the present invention;

FIG. 10 is a chart showing a second pattern of relationship between the memory controller 420 and semiconductor devices 10 in the information processing system according to an embodiment of the present invention;

FIG. 11 is a chart showing a third pattern of relationship between the memory controller 420 and semiconductor devices 10 in the information processing system according to an embodiment of the present invention; and FIG. 12 is a chart showing a fourth pattern of relationship between the memory controller 420 and semiconductor devices 10 in the information processing system according to an embodiment of the present invention.

DETAILED DESCRIPTION OF THE EMBODIMENTS

Figure 1:
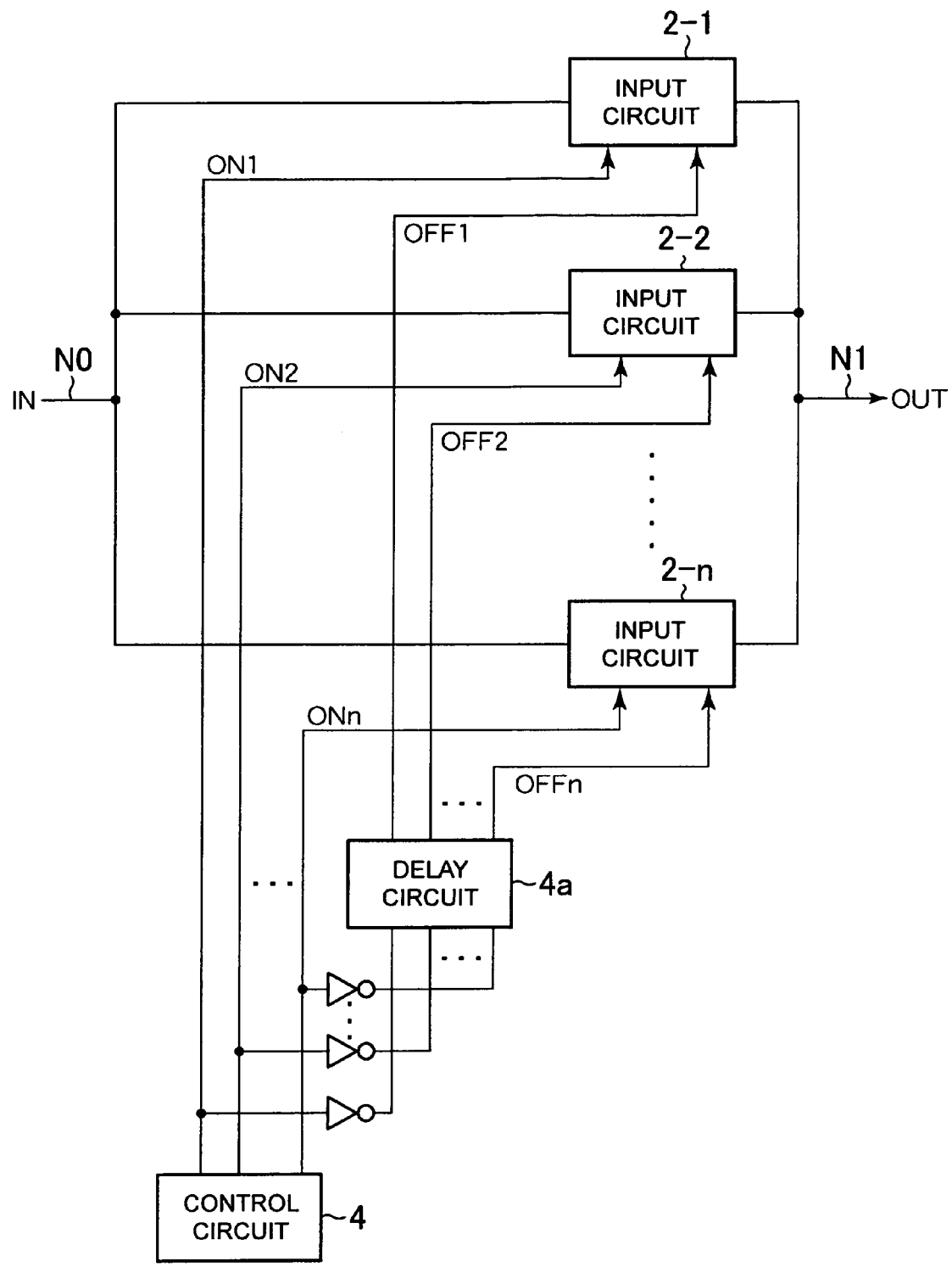
FIG. 1 is a block diagram indicative of an embodiment of the present invention.

Referring now to FIG. 1, a semiconductor device according to an embodiment of the present invention includes a plurality of input circuits 2-1 to 2-n and a control circuit 4. The input circuits 2-1 to 2-n are connected in parallel between an input node N0, which is an external terminal for receiving a signal from outside, and an output node N1, which is a connection node with a subsequent internal circuits. The control circuit 4 controls the activation and deactivation of each of the input circuits 2-1 to 2-n. An input signal IN is supplied to the input node N0. An output signal OUT is output from the output node N1.

The control circuit 4 activates any one switch signal ONi (i=1 to n) among switch signals ON1 to ONn to a logical high level for example, thereby the input circuit 2-i among the input circuits 2-1 to 2-n is activated. The input circuit 2-i is kept in the active state until its corresponding switch signal OFFi is activated. The switch signals OFF1 to OFFn are generated by inverting the switch signals ON1 to ONn, respectively. The input circuits 2-1 to 2-n are deactivated when the corresponding switch signals OFF1 to OFFn are activated to a logical high level, for example.

As shown in FIG. 1, a delay circuit 4a is interposed in the signal paths of the switch signals OFF1 to OFFn. This produces a predetermined time lag between the change of the switch signals ON1 to ONn and the change of the switch signals OFF1 to OFFn. As a result, when the switch signal to activate is changed from ONi to ONj (j=1 to n; j≠i), the input circuit 2-j is activated before the deactivation of the input circuit 2-i. In other words, there is an overlapping period in which both the input circuits 2-i and 2-j are activated, which avoids noise or hazard in the output signal OUT due to the switching of the input circuits. As employed herein, the noise occurring on the output node due to the switching of the input circuits 2-1 to 2-n will be referred to as a hazard.

Figure 2:
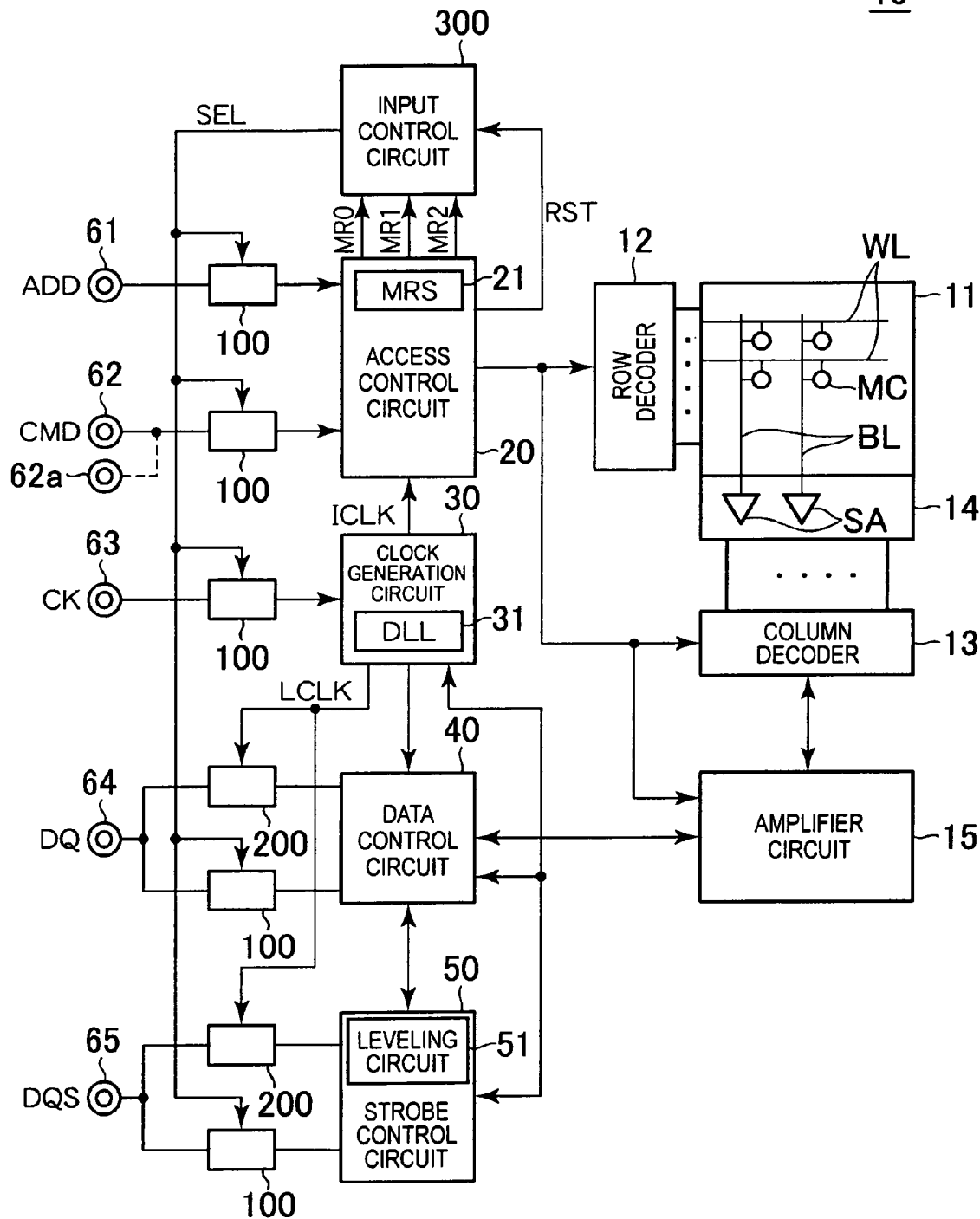
FIG. 2 is a block diagram showing the configuration of a semiconductor device 10 according to another embodiment of the present invention.

Turning to FIG. 2, a semiconductor device 10 according to an embodiment is constructed as a DRAM and includes a memory cell array 11. The memory cell array 11 includes a plurality of word lines WL and a plurality of bit lines BL which intersect each other. Memory cells MC are arranged at the intersections. The word lines WL are selected by a row decoder 12. The bit lines BL are selected by a column decoder 13. The bit lines BL are connected to respective corresponding sense amplifiers SA in a sense circuit 14. Bit lines BL selected by the column decoder 13 are connected to an amplifier circuit 15 through sense amplifiers SA.

The row decoder 12 and the column decoder 13 are controlled by an access control circuit 20. The access control circuit 20 receives an address signal ADD and a command signal CMD supplied from outside through an address terminal 61 and a command terminal 62, respectively. Based on the address signal ADD and the command signal CMD, the access control circuit 20 controls the operation of the row decoder 12, the column decoder 13, the amplifier circuit 15, etc.

Specifically, when the command signal CMD specifies an active operation, the address signal ADD is supplied to the row decoder 12. The row decoder 12 selects at least one of the word lines WL that is specified by the address signal ADD, whereby corresponding memory cells MC are connected to the bit lines BL, respectively. When the command signal CMD specifies a read operation or write operation, the address signal ADD is supplied to the column decoder 13. The column decoder 13 connects at least one of the bit lines BL specified by the address signal ADD to the amplifier circuit 15. When the command signal CMD specifies a read operation, read data DQ read from the memory cell array 11 through the sense amplifiers SA is output from a data terminal 64 to outside through the amplifier circuit 15. When the command signal CMD specifies a write operation, write data DQ supplied from outside through the data terminal 64 is written to the memory cells MC through the amplifier circuit 15 and the sense amplifiers SA.

The access control circuit 20 operates in synchronization with an internal clock signal ICLK. The internal clock signal ICLK is generated by a clock generation circuit 30 based on an external clock signal CK which is supplied from outside through a clock terminal 63. The clock generation circuit 30 includes a DLL circuit 31 that generates an internal clock signal LCLK. The internal clock signal LCLK is phase-controlled with respect to the external clock signal CK.

As shown in FIG. 2, the address terminal 61, the command terminal 62, and the clock terminal 63 are connected with respective input circuits 100. The signals supplied to the address terminal 61, the command terminal 62, and the clock terminal 63 are therefore supplied to the access control circuit 20 or the clock generation circuit 30 not directly but through the input circuits 100. The input circuits 100 are used to detect a change in signal level that varies with small amplitudes at high speed, and generate an internal signal based on the result of detection. It will be understood that the address terminal 61, the command terminal 62, and the clock terminal 63 each are composed of a plurality of terminals, accompanied with a corresponding plurality of input circuits 100. Each of the plurality of input circuits 100 shown in FIG. 2 has the functions of the input circuits 2-1 to 2-n, the delay circuit 4a, and the control circuit 4 shown in FIG. 1. The clock terminal 63 may be a plurality of clock terminals including a true CK terminal and a bar CKB terminal. In such a case, the CK terminal and the CKB terminal may be provided with one input circuit 100. The CK terminal and the CKB terminal may be provided with respective corresponding two input circuits 100. In the former case, the CK terminal and the CKB terminal are connected to first and second controlled terminals of a current mirror circuit, for example. In the latter case, the output signals of the two input circuits 100 are merged by a subsequent circuit of the two input circuits 100. Alternatively, two selectors to be disclosed later may be used for merger.

The data terminal 64 is also connected with an input circuit 100. Write data supplied from outside through the data terminal 64 is thus accepted by the input circuit 100. Meanwhile, read data to be output to outside is output from the data terminal 64 through an output circuit 200. The output circuit 200 operates in synchronization with the internal clock signal LCLK which is generated by the DLL circuit 31. The input circuit 100 and the output circuit 200 connected to the data terminal 64 are connected to the amplifier circuit 15 through a data control circuit 40. The data control circuit 40 is a circuit that performs parallel-to-serial conversion on read data and serial-to-parallel conversion on write data. In a write leveling operation to be described later, the data control circuit 40 also functions to output a skew signal to outside through the output circuit 200. It will be understood that the data terminal 64 is composed of a plurality of terminals, accompanied with a corresponding plurality of input circuits 100.

The semiconductor device 10 according to the present embodiment also includes a data strobe terminal 65. In a write operation, a strobe signal DQS is supplied from outside to the data strobe terminal 65. In a read operation, a strobe signal DQS is supplied to outside via the data strobe terminal 65. The data strobe terminal 65 is also provided with an input circuit 100 and an output circuit 200. The output circuit 200 operates in synchronization with the internal clock signal LCLK. The input circuit 100 and the output circuit 200 connected to the data strobe terminal 65 are connected to a strobe control circuit 50. In a write operation, the strobe control circuit 50 supplies the strobe signal DQS supplied from outside to the data control circuit 40, thereby controlling the timing to fetch write data. In a read operation, the strobe control circuit 50 generates a strobe signal DQS that is synchronous with read data, and outputs the strobe signal DQS to outside. It will be understood that the data strobe terminal 65 is composed of a plurality of terminals, accompanied with a corresponding plurality of input circuits 100.

The strobe control circuit 50 includes a leveling circuit 51. The leveling circuit 51 is a circuit for use in performing a write leveling operation to be described later.

The semiconductor device 10 according to the present embodiment also includes an input control circuit 300. The input control circuit 300 is a circuit for controlling the input circuits 100. The operation of the input control circuit 300 is controlled by the access control circuit 20.

Figure 3:
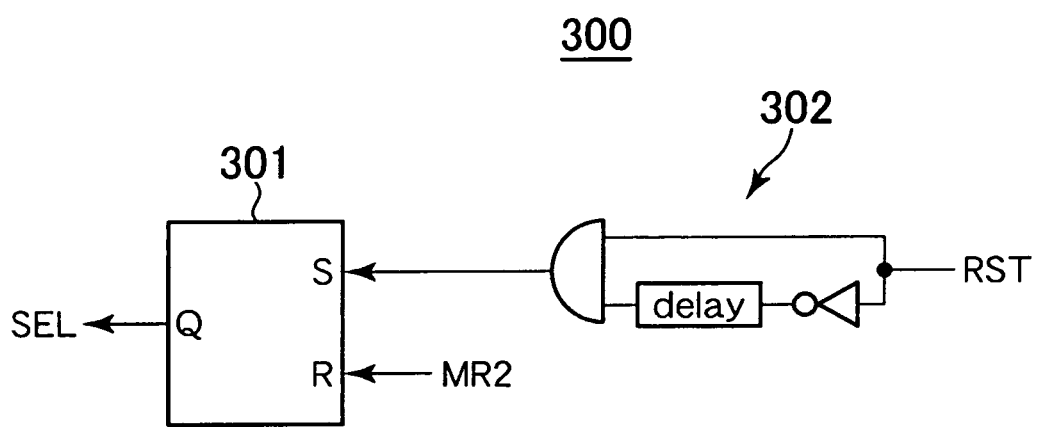
FIG. 3 is a circuit diagram indicative of an embodiment of an input control circuit 300 shown in FIG. 2.

Turning to FIG. 3, the input control circuit 300 includes an SR latch circuit 301 and a one-shot pulse generation circuit 302. The output signal of the one-shot pulse generation circuit 302 is supplied to the set input node S of the SR latch circuit 301. A mode signal MR2 is supplied to the reset input node R. The one-shot pulse generation circuit 302 is a circuit that generates a one-shot pulse when a reset signal RST changes to a high level. The reset signal RST and the mode signal MR2 both are internal signals generated by the access control circuit 20 shown in FIG. 2.

Specifically, the access control circuit 20 changes the reset signal RST to a high level when an external reset signal supplied through a reset terminal 62a, which is included in the command terminal 62, changes from an active state to an inactive state. The external reset signal is activated when an initialization operation is needed, such as at power-on. Consequently, the reset signal RST supplied to the input control circuit 300 is activated to a high level at the beginning of an initialization operation (immediately after the release of resetting).

The mode signal MR2 is a signal that becomes high level or low level depending on the value of a CAS write latency CWL which is set in a mode register 21 included in the access control circuit 20. The value of the CAS write latency CWL changes with the operating speed (operating frequency) of the semiconductor device 10. The smaller the value, the lower the speed. The greater the value, the higher the speed. In other words, in the case of a DRAM, the setting of the CAS write latency CWL indirectly indicates the operating frequency of the semiconductor device. The CAS write latency CWL indicates the latency from the issuance of a write command, followed by a lapse of an additive latency AL, to the input of write data. The absolute time of the CAS write latency CWL is basically constant. If the external clock signal CK has a low frequency, i.e., the semiconductor device 10 is operated at low speed, the CAS write latency CWL has a low value. On the other hand, if the external clock signal CK has a high frequency, i.e., the semiconductor device 10 is operated at high speed, the CAS write latency CWL has a high value.

The access control circuit 20 refers to the value of the CAS write latency CWL set in the mode register 21. If the value is lower than a predetermined value, the access control circuit 20 turns the mode signal MR2 to a high level by determining that the semiconductor device 10 is operating at low speed (low frequency). If the value is higher than or equal to the predetermined value, the access control circuit 20 turns the mode signal MR2 to a low level by determining that the semiconductor device 10 is operating at high-speed (high frequency). Since the value of the CAS write latency CWL is set from outside (by a memory controller or the like) in an initial sequence after the power-on of the semiconductor device, the mode signal MR2 changes after the activation of the reset signal RST. Whether the semiconductor device is operating at low frequency or high frequency is concerned with the operating frequency of the front end portion, or interface, of the semiconductor device, typified by the input circuits 100. The back end portion, typified by the memory cell array 11, operates at a predetermined operating frequency regardless of the operating frequency of the front end portion. The back end portion includes the memory cell array 11, the row decoder 12, the column decoder 13, and the amplifier circuit 15. The other components belong to the front end portion.

A switch signal SEL output from the output node Q of the SR latch circuit 301 is thus at a high level when in an initial state. When the value of the CAS write latency CWL is set afterward, the switch signal SEL is either maintained at the high level or changed to a low level. More specifically, when the semiconductor device 10 is operating at high speed, the switch signal SEL is maintained at the high level. When the semiconductor device 10 is operating at low speed, the switch signal SEL is changed to the low level. The switch signal SEL generated thus is supplied to the plurality of input circuits 100 shown in FIG. 2 in common.

Figure 4:
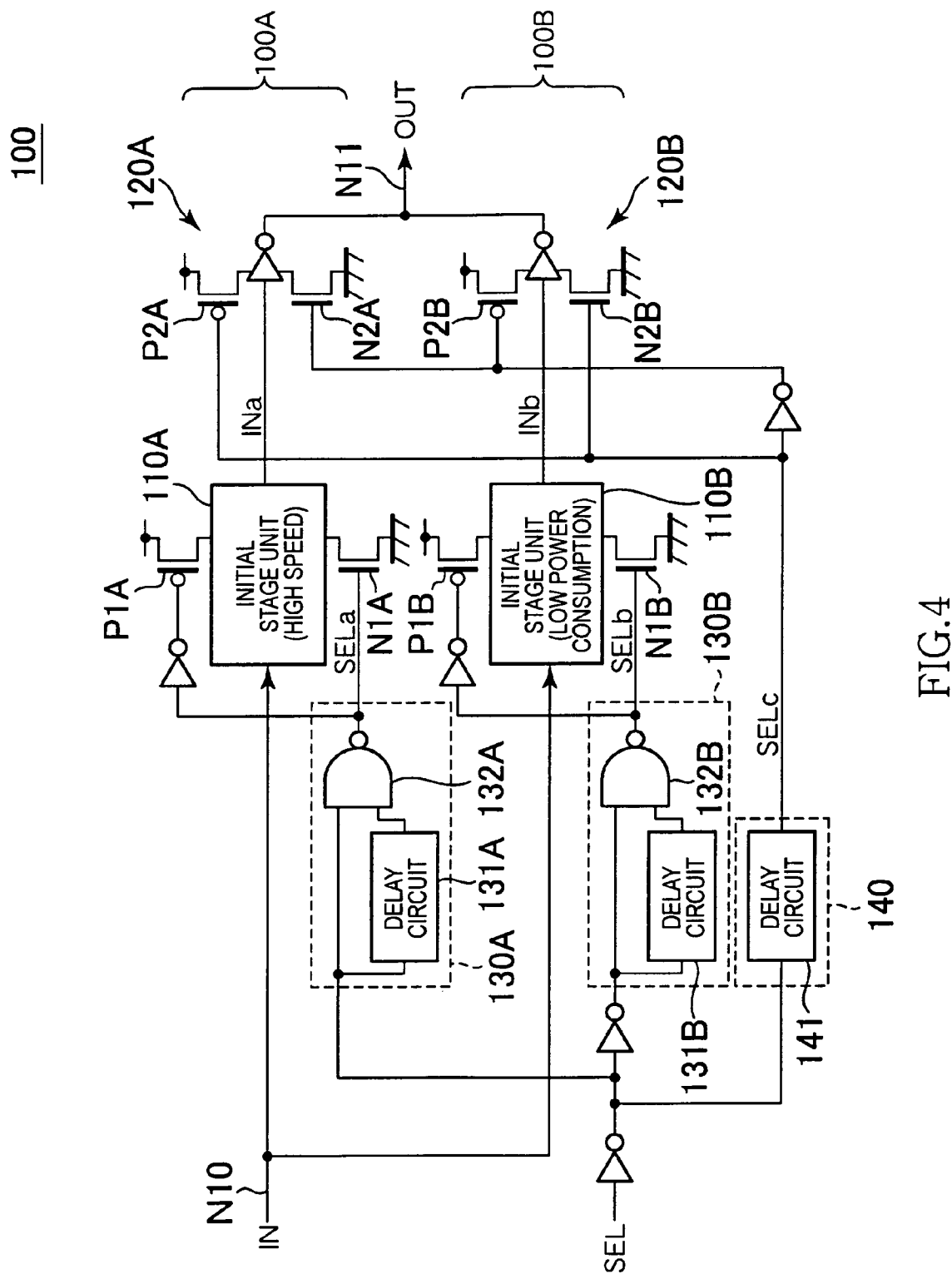
FIG. 4 is a circuit diagram indicative of an embodiment of an input circuit 100 shown in FIG. 2.

Turning to FIG. 4, an input circuit 100 includes a first input circuit 100A and a second input circuit 100B which are connected in parallel between an input node N10 and an output node N11. The input node N10 represents a corresponding terminal (address terminal 61, command terminal 62, clock terminal 63, data terminal 64, or data strobe terminal 65). The output node N11 represents the input node of a corresponding internal circuit (access control circuit 20, clock generation circuit 30, data control circuit 40, or strobe control circuit 50).

The input circuit 100A includes a first initial stage unit 110A and a first output unit 120A which are serially connected in this order between the input node N10 and the output node N11. Similarly, the input circuit 100B includes a second initial stage unit 110B and a second output unit 120B which are serially connected in this order between the input node N10 and the output node N11. The initial stage units 110A and 110B are circuits for detecting the potential of the input node N10. Although not limited in particular, the initial stage units 110A and 110B are preferably composed of current mirror circuits. The output units 120A and 120B are tri-state selectors for supplying either one of the outputs INa and INb of the initial stage units 110A and 110B to the output node N11. The output units 120A and 120B are exclusively activated.

The initial stage unit 110A is designed to have an operating speed higher than that of the initial stage unit 110B. The initial stage unit 110B is designed to have power consumption lower than that of the initial stage unit 110A. Such differences in characteristics can be implemented by making different bias currents to flow through the current mirror circuits that constitute the initial stage units 110A and 110B. More specifically, the bias current of the initial stage unit 110A is designed to be relatively higher, and the bias current of the initial stage unit 110B relatively lower.

The input circuits 100A and 100B are selected by the switch signal SEL. Specifically, if the switch signal SEL is at a high level, a P-channel MOS transistor P1A and an N-channel MOS transistor N1A for supplying an operating voltage to the initial stage unit 110A are turned ON by the logic circuit that includes a timing adjustment circuit 130A. In addition, a P-channel MOS transistor P2A and an N-channel MOS transistor N2A for supplying an operating voltage to the output unit 120A are turned ON by the logic circuit that includes a timing adjustment circuit 140. This consequently activates the input circuit 100A, and the input signal IN supplied to the input node N10 is output as output data OUT from the output node N11 through the input circuit 100A. In the meantime, a P-channel MOS transistor P1B and an N-channel MOS transistor N1B for supplying an operating voltage to the initial stage unit 110B are turned OFF by the logic circuit that includes a timing adjustment circuit 130B. A P-channel MOS transistor P2B and an N-channel MOS transistor N2B for supplying an operating voltage to the output unit 120B are turned OFF by the logic circuit that includes the timing adjustment circuit 140. This deactivates the input circuit 100B.

On the other hand, if the switch signal SEL is at a low level, the P-channel MOS transistor P1B and the N-channel MOS transistor N1B for supplying the operating voltage to the initial stage unit 110B are turned ON by the logic circuit that includes the timing adjustment circuit 130B. In addition, the P-channel MOS transistor P2B and the N-channel MOS transistor N2B for supplying the operating voltage to the output unit 120B are turned ON by the logic circuit that includes the timing adjustment circuit 140. This consequently activates the input circuit 100B, and the input signal IN supplied to the input node N10 is output as output data OUT from the output node N11 through the input circuit 100B. In the meantime, the P-channel MOS transistor P1A and the N-channel MOS transistor N1A for supplying the operating voltage to the initial stage unit 110A are turned OFF by the logic circuit that includes the timing adjustment circuit 130A. The P-channel MOS transistor P2A and the N-channel MOS transistor N2A for supplying the operating voltage to the output unit 120A are turned OFF by the logic circuit that includes the timing adjustment circuit 140. This consequently deactivates the input circuit 100A.

The foregoing operation is for situations where the switch signal SEL is unchanged, i.e., in a steady state. If the switch signal SEL changes, there is provided some period in which both the initial stage units 110A and 110B are activated by the timing adjustment circuits 130A and 130B. As shown in FIG. 4, the timing adjustment circuit 130A includes a delay circuit 131A and a NAND gate circuit 132A. The inverted switch signal SEL and the same signal delayed by the delay circuit 131A are input to the NAND gate circuit 132A. The output signal of the NAND gate circuit 132A is simply supplied to the gate of the transistor N1A while the inverted signal thereof is supplied to the gate of the transistor P1A. Similarly, the timing adjustment circuit 130B includes a delay circuit 131B and a NAND gate circuit 132B. The switch signal SEL and the same signal delayed by the delay circuit 131B are input to the NAND gate circuit 132B. The output signal of the NAND gate circuit 132B is simply supplied to the gate of the transistor N1B while the inverted signal thereof is supplied to the gate of the transistor P1B.

Figure 5:
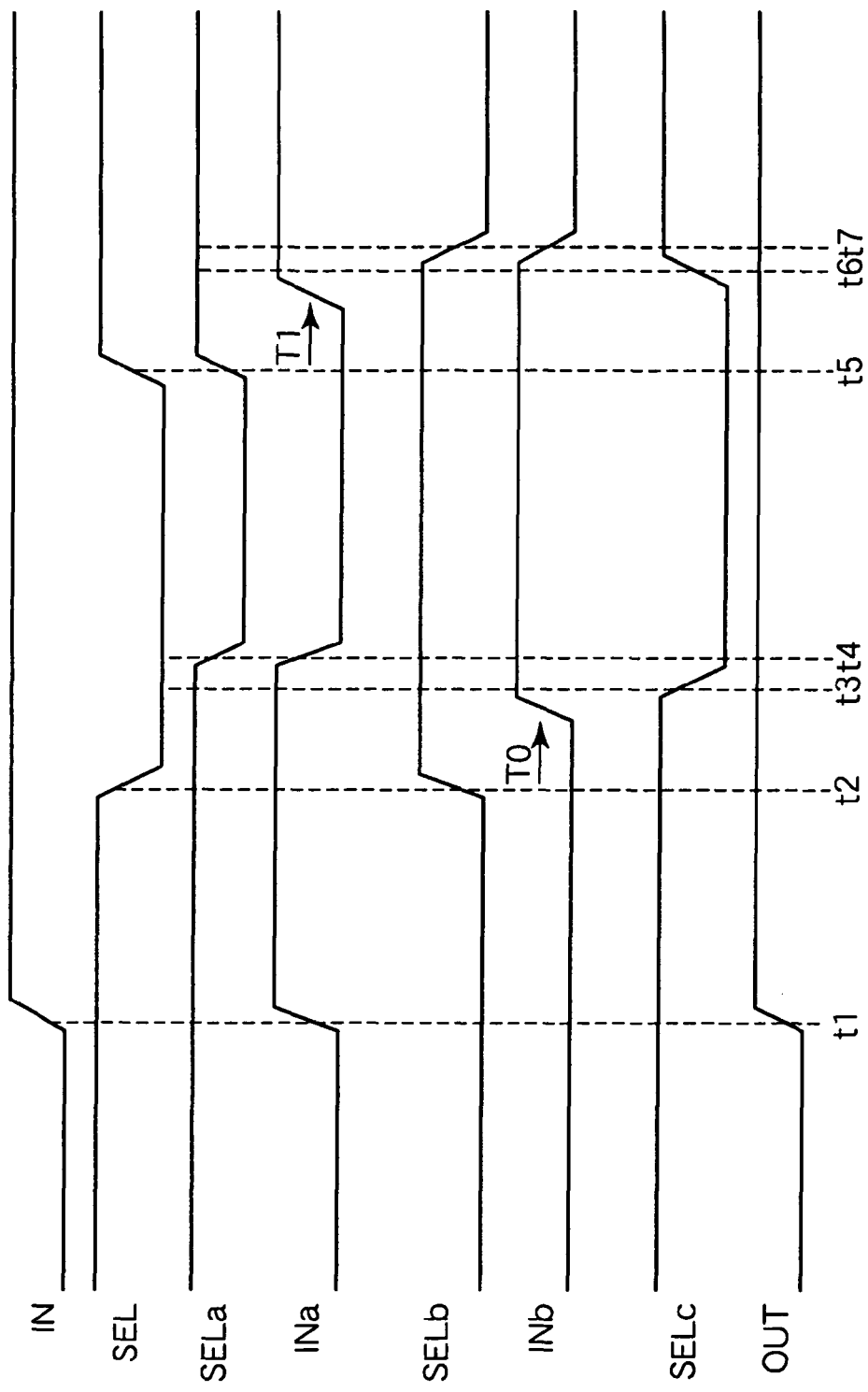
FIG. 5 is a timing chart for explaining the relationship between the change of a switch signal SEL and the states of initial stage units 110A and 110B shown in FIG. 4.

Turning to FIG. 5, the switch signal SEL is at a high level at time t1 when the input signal IN changes from a low level to a high level. Then, at time t2, the switch signal SEL changes to a low level. At time 5, the switch signal SEL changes to a high level again. In other words, the input circuit 100A is selected before time t2 and after time t5. The input circuit 100B is selected in the period between time t2 and time t5.

When the switch signal SEL changes to a low level at time t2, the output signal of the timing adjustment circuit 130B, or a switch signal SELb, changes to a high level immediately. The reason is that the output signal of the delay circuit 131B is irrelevant to the change of the switch signal SELb from a low level to a high level. Consequently, the initial stage unit 110B changes from an inactive state to an active state. In fact, it takes a predetermined time T0 for the output signal INb of the initial stage unit 110B to stabilize. The output signal INb of the initial stage unit 110B therefore changes to a high level with some delay after time t2.

In the meantime, the output signal of the timing adjustment circuit 130A, or a switch signal SELa, remains at a high level. The reason is that the output signal of the delay circuit 131A is needed as a signal for changing the switch signal SELa from a high level to a low level. The initial stage unit 110A therefore maintains the active state even after the activation of the initial stage unit 110B. At time t4, the switch signal SELa changes to a low level, and then the output signal INa of the initial stage unit 110A changes to a low level. The period from time t2 to time t4 corresponds to the amount of delay of the delay circuit 131A. The amount of delay of the delay circuit 131A is set to be longer than the time T0 it takes for the output signal INb of the initial stage unit 110B to stabilize after the change of the initial stage unit 110B from the inactive state to the active state.

Now, at time t3 immediately before time t4, the output signal of the timing adjustment circuit 140, or a switch signal SELc, changes from a high level to a low level. As shown in FIG. 4, the timing adjustment circuit 140 includes a delay circuit 141. The period from time t2 to time t3 corresponds to the amount of delay of the delay circuit 141. Since the switch signal SELc reaches the output units 120A and 120B at substantially the same time, the output unit 120A is switched to the output unit 120B at time t3. Consequently, the output signal of the output unit 120A changes from a low impedance state to a high impedance state with respect to the output node N11. The output signal of the output unit 120B changes from a high impedance state to a low impedance state with respect to the output node N11. The output signal OUT is thus driven by the output unit 120B.

An operation opposite to the above-described operation is performed when the switch signal SEL changes from a low level to a high level. More specifically, when the switch signal SEL changes to a high level at time t5, the output signal of the timing adjustment circuit 130A, or switch signal SELa, changes to a high level immediately. The initial stage unit 110A changes from an inactive state to an active state. Meanwhile, the output signal of the timing adjustment circuit 130B, or switch signal SELb, remains at a high level until time t7. The initial stage unit 110B therefore maintains its active state. At time t7, the switch signal SELb changes to a low level, and then the output signal INb of the initial stage unit 110B changes to a low level. The period from time t5 to time t7 corresponds to the amount of delay of the delay circuit 131B. The amount of delay of the delay circuit 131B is set to be longer than a time T1 it takes for the output signal INa of the initial stage unit 110A to stabilize after the change of the initial stage unit 110A from the inactive state to the active state.

Now, at time t6 immediately before time t7, the output signal of the timing adjustment circuit 140, or switch signal SELc, changes from a low level to a high level. Consequently, the output signal of the output unit 120B changes from a low impedance state to a high impedance state with respect to the output node N11. The output signal of the output unit 120A changes from a high impedance state to a low impedance state with respect to the output node N11. The output signal OUT is thus driven by the output unit 120A.

As described above, according to the present embodiment, the switch signal SEL is changed to switch either one of the input circuits 100A and 100B from active to inactive and the other from inactive to active. Here, the provision of the period in which both the initial stage units 110A and 110B are activated avoids a hazard to the output signal OUT due to the switching. Moreover, the amount of delay of the delay circuit 141 is set to be slightly shorter than those of the delay circuits 131A and 131B. This enables proper generation of the output signal OUT even if the input signal IN changes in the middle of the switching operation. The reason is that the other initial stage unit which is switched from inactive to active responds to the changed input signal IN. More specifically, the amount of delay of the delay circuit 141 is set to the time to elapse until the initial stage unit 110A or 110B that is controlled from inactive to active outputs the signal corresponding to the level of the input signal IN. On the other hand, the amounts of delay of the delay circuits 131A and 131B for adjusting the time to switch from active to inactive are set to the time, or even later, when the switching of the selectors or output units 120A and 120B is completed. It should be noted that in the present invention, it is not absolutely necessary to set the amount of delay of the delay circuit 141 to be shorter than those of the delay circuits 131A and 131B. The amounts of delay may be the same.

In the present embodiment, the input circuit 100A having a higher operating speed is selected in the initial state where the reset signal RST occurs. Even if high-speed command signals CMD and the like are input before the mode signal MR2 is settled, such signals can be properly accepted into the semiconductor device 10.

Consequently, it is possible to automatically switch the input circuits 100A and 100B of different characteristics depending on the operating speed, and avoid a hazard to the output signal OUT due to the switching.

Figure 6:
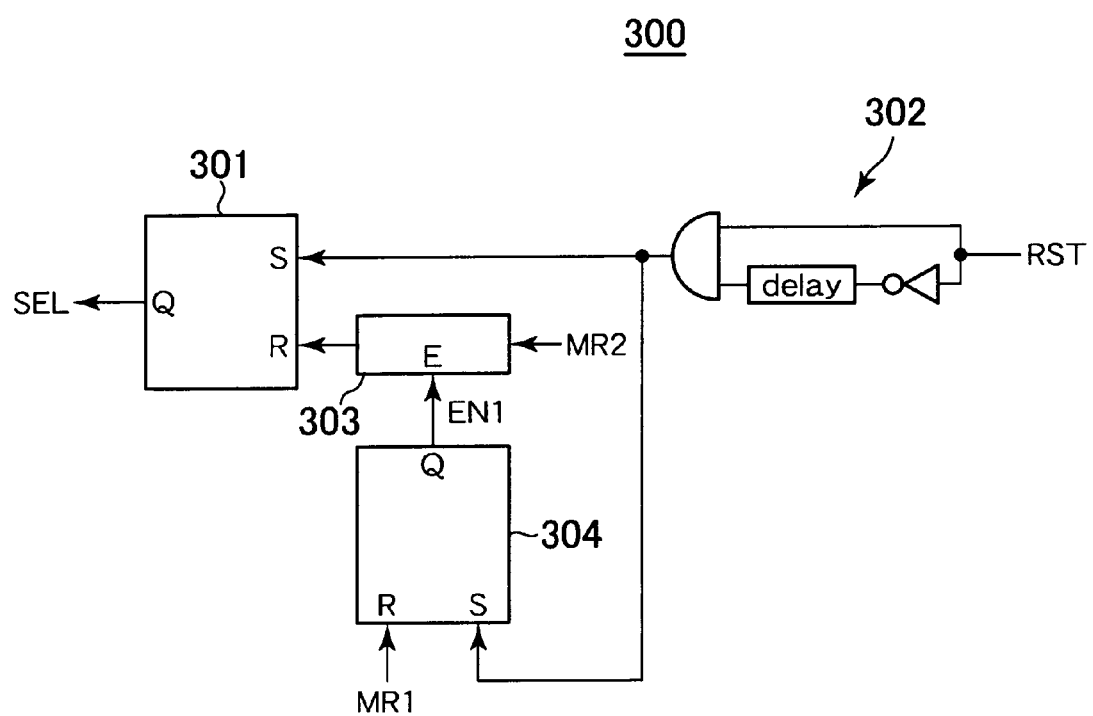
FIG. 6 is a circuit diagram indicative of another embodiment of the input control circuit 300.

Turning to FIG. 6, the mode signal MR2 is supplied to the reset input node R of the SR latch circuit 301 through an enable circuit 303. The enable circuit 303 is a circuit that allows the passage of the mode signal MR2 if an enable signal EN1 supplied to its enable node E is at a high level. If the enable signal EN1 is at a low level, the reset input node R is kept at a low level regardless of the level of the mode signal MR2.

The enable signal EN1 is generated by an SR latch circuit 304. The output signal of the one-shot pulse generation circuit 302 is supplied to the set input node S of the SR latch circuit 304. A mode signal MR1 is supplied to the reset input node R. The mode signal MR1 is an internal signal generated by the access control circuit 20 shown in FIG. 2. Specifically, the mode signal MR1 is at a low level before a write leveling operation is performed. The mode signal MR1 is turned to a high level after the write leveling operation is performed.

Now, the write leveling operation will be described in conjunction with the connection relationship between semiconductor devices and a memory controller.

Figure 7:
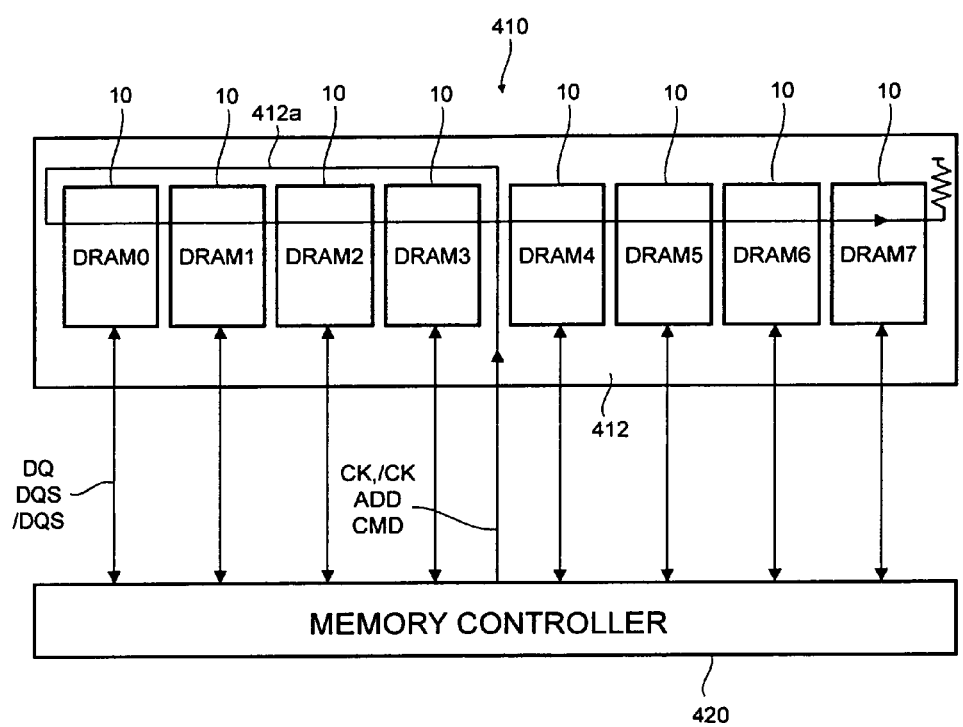
FIG. 7 is a diagram showing the configuration of an information processing system according to still another embodiment of the present invention.

Turning to FIG. 7, The information processing system shown in FIG. 7 includes a memory module 410 and a memory controller 420 connected thereto. The memory module 410 is configured so that a plurality of semiconductor devices 10 (DRAM0 to DRAM7) are mounted on a module substrate 412. While the memory module 410 shown in FIG. 7 has the configuration that eight semiconductor devices 10 (DRAM0 to DRAM7) are mounted on the module substrate 412, the number of semiconductor devices 10 mounted on the module substrate 412 is not limited thereto. As for mounting positions, the semiconductor devices 10 may be mounted on either one or both sides of the module substrate 412.

The semiconductor devices 10 are not limited to any particular type, either. In the present embodiment, DDR3 (Double Data Rate 3) DRAMs are used. As compared to DDR2 DRAMs, DDR3 DRAMs have a power supply voltage approximately 17% lower (reduced from 1.8 V to 1.5V). For double-frequency operation, the connection mode between the memory module 410 and the memory controller 420 is changed.

Specifically, as shown in FIG. 7, the data DQ (read data and write data) and the data strobe signals DQS and /DQS are connected at almost equal, minimum distances between the memory module 410 and the memory controller 420. Such connection enables high-speed data transfer up to 2.1 Gbps. On the other hand, the clock signals CK and /CK, the address signal ADD, and the command signal CMD are connected to the same bus 412a laid on the module substrate 412 by fly-by connection. The fly-by connection refers to a connection method of so-called single stroke mode. The fly-by method can be employed to reduce the total wiring length and the number of wires in the module substrate 412 as compared to a DDR2 equal-length wiring method. This eases the restrictions on the layout of the bus 412a, allowing high quality wiring layout. A high-speed address and command transfer up to 1.067 Gbps (one half the transfer rate of DQ and DQS) is made possible.

The use of the fly-by method, however, makes the skew of the data DQ and the data strobe signal DQS and that of the clock signal CK largely different depending on the mounting positions of the semiconductor devices 10 on the module substrate 412. In the example shown in FIG. 7, the DRAM0 which is the closest to the memory controller 420 has the minimum skew. The DRAM7 farthest from the memory controller 420 has the maximum skew. If the data DQ and the data strobe signal DQS are output in time with the skew of the DRAM0, the clock signal CK lags behind the data DQ and the data strobe signal DQS in the DRAM1 to DRAM7, with the maximum delay in the DRAM7. The same holds true vice versa. If the data DQ and the data strobe signal DQS are output in time with the skew of the DRAM7, the clock signal CK leads the data DQ and the data strobe signal DQS in the DRAM0 to DRAM6, with the maximum lead in the DRAM0.

Consequently, it is needed to adjust the output timing of the data DQ and the data strobe signal DQS with respect to each of the DRAM0 to DRAM7. An operation needed for such adjustments, including measurement and correction (calibration) of the amounts of skew, is the write leveling operation. The memory controller 420 makes the DRAM0 to DRAM7 periodically enter a write leveling mode not only at the time of system startup but also during operation after the system startup. The memory controller 420 thereby regularly monitors the skews which vary with operating conditions such as temperature and power supply voltage, and adjusts the output timing of the data strobe signal DQS.

In entering the write leveling mode, the DRAM0 to DRAM7 sample the clock signal CK at the rising edges of the data DQ and the data strobe signal DQS supplied from the memory controller 420, and output the sampling results as data DQ through their data terminals. As a result, the memory controller 420 can grasp the amounts of skew of the data DQ, the data strobe signal DQS, and the clock signal CK, and adjust the output timing of the data DQ and the data strobe signal DQS accordingly.

The above is the write leveling operation. The write leveling operation is started based on a predetermined command signal issued from the memory controller 420, and is performed by the leveling circuit 51 shown in FIG. 2. As described above, the write leveling operation is periodically performed even during operation after the system startup. If an external reset signal to a DRAM is activated and then the write leveling operation is performed on the DRAM at least once, the mode signal MR1 is fixed to a high level. Since the mode signal MR1 resets the SR latch circuit 304 shown in FIG. 6, the mode signal MR2 (the setting of the CAS write latency CWL) is disabled once the write leveling operation is performed.

After the skew of the data strobe signal DQS is resolved by the write leveling operation (after the timing of the data strobe signal DQS and that of the clock signal CK are matched), the switching of the input circuits 100 is disabled. The reason is that if the characteristics of the input circuit 100 in connection with the data terminal 64 or the data strobe terminal 65 are changed after the write leveling operation, the condition made different from in the write leveling operation can produce a new skew. Such a problem, however, will not occur since the use of the input control circuit 300 shown in FIG. 6 inhibits changing the switch signal SEL after write leveling. It should be noted that such control is only applied to the input circuits 100 of the data DQ, the data strobe signal DQS, and the clock signal CK. More specifically, each semiconductor device 10 includes both the input control circuit 300 of FIG. 3, which is associated with the address terminal 61 and the command terminal 62, and the input control circuit 300 of FIG. 6, which is associated with the data terminal 64, the data strobe terminal 65, and the clock terminal 63.

Another method that effectively solves the foregoing problem is to suspend the issuance of the command for performing write leveling until the level of the mode signal MR2 (the setting of the CAS write latency CWL) is settled under the control of the memory controller 420. The command (MR1) for performing write leveling is then issued after the level of the mode signal MR2 is settled. Such a method can solve the foregoing problem because the mode signal MR2 is prevented from changing in value after the write leveling is performed.

Figure 8:
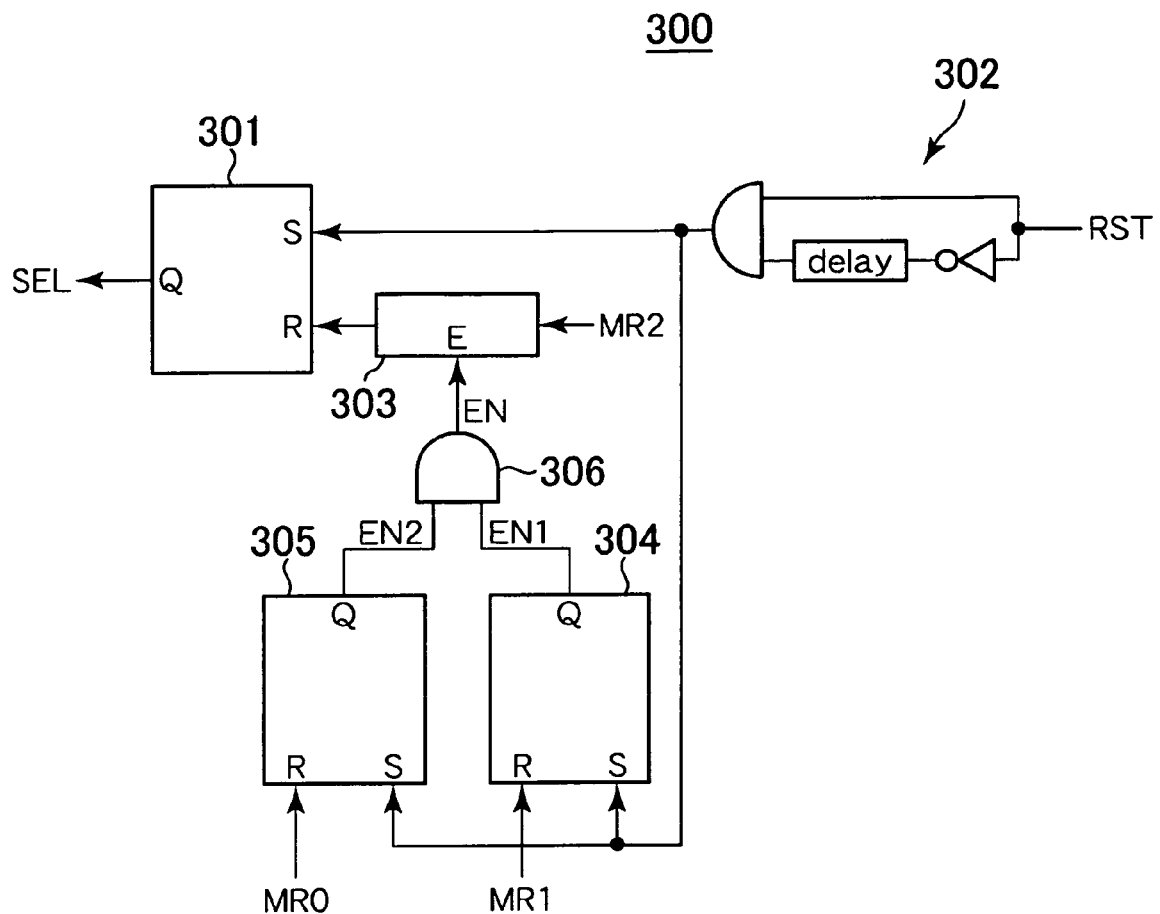
FIG. 8 is a circuit diagram indicative of still another embodiment of the input control circuit 300.

Turning to FIG. 8, an SR latch circuit 305 is added further. The output signal of the one-shot pulse generation circuit 302 is supplied to the set input node S of the SR latch circuit 305. A mode signal MR0 is supplied to the reset input node R. The mode signal MR0 is also an internal signal generated by the access control circuit 20 shown in FIG. 2. Specifically, the mode signal MR0 is at a low level when in a state where the DLL circuit 31 is not locked. The mode signal MR0 is at a high level when in a state where the DLL circuit 31 is locked. The state where the DLL circuit 31 is locked refers to a state where the internal clock signal LCLK, phase-controlled by the DLL circuit 31, is generated based on the external clock signal CK.

The output signal of the SR latch circuit 305, or an enable signal EN2, is supplied to an AND gate circuit 306 along with the enable signal EN1. The output signal EN of the AND gate circuit 306 is supplied to the enable node E of the enable circuit 303. Consequently, if at least either one of the mode signals MR0 and MR1 is activated to a high level, the passage of the mode signal MR2 is thereafter disabled until the next activation of the reset signal RST.

The switching of the input circuits 100 is thereby disabled after the DLL circuit 31 is locked. The reason is that if the characteristics of the input circuit 100 in connection with the clock terminal 63 are changed after the locking of the DLL circuit 31, the condition made different from at the time of the DLL locking may shift the phase of the clock signal LCLK. Such a problem, however, will not occur since the use of the input control circuit 300 shown in FIG. 8 inhibits changing the switch signal SEL after the locking of the DLL circuit 31. It should be noted that such control is only applied to the input circuit 100 of the clock signal CK. More specifically, the semiconductor device 10 includes the input control circuit 300 of FIG. 3 which is associated with the address terminal 61 and the command terminal 62, the input control circuit 300 of FIG. 6 which is associated with the data terminal 64 and the data strobe terminal 65, and the input control circuit 300 of FIG. 8 which is associated with the clock terminal 63.

Another method that effectively solves the foregoing problem is to suspend the issuance of the command for activating the DLL circuit 31 until the level of the mode signal MR2 is settled under the control of the memory controller 420. The command for activating the DLL circuit 31 is then issued after the level of the mode signal MR2 is settled. Such a method can solve the foregoing problem because the mode signal MR2 is prevented from changing in value after the locking of the DLL circuit 31.

Each of FIGS. 9 to 12 is a chart showing the relationship between the memory controller 420 and semiconductor device in an information processing system according to a preferred embodiment of the present invention.

FIG. 9 shows a first pattern of a plurality of commands supplied from memory controller to the semiconductor device along the time axis (T1 to T6). FIG. 9 also shows a selected one of the first input circuits 100A and the second input circuits 100B (see FIG. 4) with respect to each of the ADD/CMD input circuits, the DQ/DQS input circuits, and the CK input circuit included in the semiconductor device. Here, the input control circuit 300 of FIG. 8 is used. In T1, the semiconductor device is powered on, and then the memory controller issues a reset command to the semiconductor device. In T1, the ADD/CMD input circuits, the DQ/DQS input circuits, and the CK input circuit each select the first input circuit 100A (having a high-speed characteristic) by default. In T2, the memory controller issues a second command MR1 to the semiconductor device. Here, the DQ/DQS input circuits and the CK input circuit each select the first input circuit 100A, thereby a write leveling operation is performed in such environment. In T3, the memory controller issues a third command MR0 to the semiconductor device. Here, the CK input circuit selects the first input circuit 100A, thereby a DLL adjustment operation is performed in such environment. In the meantime, the DQ/DQS input circuits can maintain the matched timing of write leveling. In T4, the memory controller issues a first command MR2 that specifies a low-speed operation to the semiconductor device. Here, the ADD/CMD input circuits switch from the first input circuits 100A to the second input circuits 100B. In the meantime, the DQ/DQS input circuits and the CK input circuit each maintain the first input circuit 100A selected. As a result, the semiconductor device can achieve low power consumption in the ADD/CMD input circuits while the DQ/DQS input circuits and the CK input circuit maintain the matched timing of write leveling and DLL, respectively. In T5, the memory controller issues an active command for accessing the memory cell array 11 (see FIG. 2) of the semiconductor device. The ADD/CMD input circuits continue selecting the second input circuits 100B. The DQ/DQS input circuits and the CK input circuit each maintain the first input circuit 100A selected. In T6, the memory controller issues a first command MR2 that specifies a high-speed operation to the semiconductor device. Here, the ADD/CMD input circuits switch from selection of the second input circuits 100B to selection of the first input circuits 100A. In the meantime, the DQ/DQS input circuits and the CK input circuit each maintain the first input circuit 100A selected. In T7 (not shown) subsequent to T6, the memory controller issues an active command to the semiconductor device. The ADD/CMD input circuits continue selecting the first input circuits 100A. The DQ/DQS input circuits and the CK input circuit each maintain the first input circuit 100A selected. In T8 (not shown) subsequent to T7, the memory controller issues a reset command to the semiconductor device. Here, the ADD/CMD input circuits, the DQ/DQS input circuits, and the CK input circuit each select the first input circuit 100A. It should be noted that the phrase "continue selecting" means that the ADD/CMD input circuits can switch the selection of the first input circuit 100A and the second input circuit 100B depending on a first command MR2 to be supplied later. The phrase "maintain . . . selected" means that none of the DQ/DQS input circuits and the CK input circuit can switch the selection of the first input circuit 100A and the second input circuit 100B depending on a first command MR2 to be supplied later.

FIG. 10 shows a second pattern of a plurality of commands supplied from memory controller to the semiconductor device along the time axis (T1 to T6). Differences from the first pattern will be described in detail. In T2, the memory controller issues the third command MR0 to the semiconductor device. Here, the CK input circuit selects the first input circuit 100A, thereby the DLL adjustment operation is performed in such environment. In T3, the memory controller issues a first command MR2 that specifies a low-speed operation to the semiconductor device. Here, the ADD/CMD input circuits and the DQ/DQS input circuits switch from selection of the first input circuit 100A to selection of the second input circuits 100B. In the meantime, the CK input circuit maintains the first input circuit 100A selected. As a result, the semiconductor device can achieve low power consumption with the ADD/CMD input circuits and the DQ/DQS input circuits while the CK input circuit maintains the matched DLL timing. In T4, the memory controller issues the second command MR1 to the semiconductor device. Here, the DQ/DQS input circuits continue selecting the second input circuits 100B and the CK input circuit maintains the first input circuit 100A selected, thereby the write leveling operation is performed in such environment. In the meantime, the CK input circuit can maintain the matched DLL timing. In T5, the memory controller issues an active command to the semiconductor device. The ADD/CMD input circuits and the DQ/DQS input circuits maintain the second input circuits 100B selected. The CK input circuit maintains the first input circuit 100A selected. In T6, the memory controller issues a reset command to the semiconductor device. Here, the ADD/CMD input circuits, the DQ/DQS input circuits, and the CK input circuit each select the first input circuit 100A.

FIG. 11 shows a third pattern of a plurality of commands supplied from memory controller to the semiconductor device along the time axis (T1 to T5). Differences from the first pattern will be described in detail. In T2, the memory controller issues a first command MR2 that specifies a low-speed operation to the semiconductor device. Here, the ADD/CMD input circuits, the DQ/DQS input circuits, and the CK input circuit each switch from selection of the first input circuit 100A to selection of the second input circuit 100B. In T3, the memory controller issues the third command MR0 to the semiconductor device. Here, the CK input circuit selects the second input circuit 100B, the DLL adjustment operation is performed in such environment. In T4, the memory controller issues the second command MR1 to the semiconductor device. Here, the DQ/DQS input circuits continue selecting the second input circuits 100B and the CK input circuit maintains the second input circuit 100B selected, thereby the write leveling operation is performed in such environment. In the meantime, the CK input circuit can maintain the matched DLL timing. In T5, the memory controller issues an active command to the semiconductor device. Here, the ADD/CMD input circuits continue selecting the second input circuits 100B. The DQ/DQS input circuits and the CK input circuit each maintain the second input circuit 100B selected.

FIG. 12 a fourth pattern of a plurality of commands supplied from memory controller to the semiconductor device along the time axis (T1 to T5). Differences from the third pattern will be described in detail. After the semiconductor device is powered on, the memory controller issues a reset command to the semiconductor device. In T1, the ADD/CMD input circuits, the DQ/DQS input circuits, and the CK input circuit each select the second input circuit 100B (having a low-speed characteristic) by default. In T2, the memory controller issues a first command MR2 that specifies a high-speed operation to the semiconductor device. Here, the ADD/CMD input circuits, the DQ/DQS input circuits, and the CK input circuit each switch from selection of the second input circuit 100B to selection of the first input circuit 100A. In T3, the memory controller issues the third command MR0 to the semiconductor device. Here, the CK input circuit selects the first input circuit 100A, thereby the DLL adjustment operation is performed in such environment. In T4, the memory controller issues the second command MR1 to the semiconductor device. Here, the DQ/DQS input circuits continue selecting the first input circuits 100A and the CK input circuit maintains the first input circuit 100A selected, thereby the write leveling operation is performed in such environment. In the meantime, the CK input circuit can maintain the matched DLL timing. In T5, the memory controller issues an active command to the semiconductor device. Here, the ADD/CMD input circuits continue selecting the first input circuits 100A. The DQ/DQS input circuits and the CK input circuit each maintain the first input circuit 100A selected.

It is apparent that the present invention is not limited to the above embodiments, but may be modified and changed without departing from the scope and spirit of the invention.

The technical concept of the present invention is applicable to input circuits of various circuit types (including COMS type and current mirror type). It should be noted that the forms of the circuits in the circuit blocks disclosed in the drawings and other circuits for generating control signals are not limited to the circuit forms disclosed in the embodiments.

The technical concept of the present invention can be applied to various types of semiconductor devices. For example, the present invention can be applied to a general semiconductor device such as a CPU (Central Processing Unit), an MCU (Micro Control Unit), a DSP (Digital Signal Processor), an ASIC (Application Specific Integrated Circuit), an ASSP (Application Specific Standard Product), and Memory. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When an FET (Field Effect Transistor) is used as the transistor in the present invention, various types of FETs such as MIS (Metal-Insulator Semiconductor) and TFT (Thin Film Transistor) can be used as well as MOS (Metal Oxide Semiconductor). Further, transistors other than FETs such as bipolar transistors can be used as some of transistors.

In addition, an NMOS transistor (N-channel MOS transistor) is a representative example of a second conductive transistor, and a PMOS transistor (P-channel MOS transistor) is a representative example of a first conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following system:

A1. An information processing system, comprising:

a semiconductor device that includes a reset terminal, a plurality of terminals including at least an address terminal, a command terminal, a clock terminal, a data terminal, and a data strobe terminal, and a plurality of input circuits each connected to an associated one of the plurality of terminals; and a controller that is connected to the reset terminal and the plurality of terminals of the semiconductor device, wherein the controller issues a reset command to the reset terminal at first timing, and then issues a first command to at least any one of the plurality of terminals at second timing subsequent to the first timing, the first command specifying an operating speed of the semiconductor device, and the controller issues a second command or a third command to at least any one of the plurality of terminals at third timing subsequent to the second timing, the second command activating a write leveling circuit to perform a write leveling operation of adjusting output timing of a write data or a data strobe signal, and the third command activating a DLL circuit included in the semiconductor device.

A2. The information processing system as A1, wherein each of the plurality of input circuits includes first and second input units connected to an associated one of the plurality of terminals, the semiconductor device further includes a control circuit that controls the first and second input units, the control circuit activates either one of the first and second input units and deactivates other of the first and second input units in each of the plurality of input circuits based on the first command that is issued for a first time, and after the third command is ones issued, even if the first command is further issued for a second time, the control circuit maintains a state of the first and second input units connected to the clock terminal as controlled by the first command that is issued for the first time.

A3. The information processing system as A2, wherein each of the plurality of input circuits further includes a selector that outputs either one of output signals of the first and second input units, the control circuit further controls the selector, the control circuit controls the selector to select the output signal supplied from activated one of the first and second input units based on the first command that is issued for the first time, and after the third command is ones issued, even if the first command is further issued for the second time, the control circuit maintains a state of the selector associated with the clock terminal as controlled by the first command that is issued for the first time.

A4. The information processing system as A3, wherein after the second command is once issued subsequent to the third command, even if the first command is further issued for the second time, the control circuit maintains the state of the first and second input units connected to the clock terminal as controlled by the first command that is issued for the first time.

A5. The information processing system as A4, wherein after the second command is once issued subsequent to the third command, even if the first command is further issued for the second time, the control circuit maintains the state of the selector associated with the clock terminal as controlled by the first command that is issued for the first time.

A6. The information processing system as A2, wherein when the first command for the second time is further issued subsequent to the third command, the control circuit updates each selection of the first and second input units connected to one of the address terminal and the command terminal based on the first command that is supplied for the second time.

A7. The information processing system as A3, wherein when the first command for the second time is further issued subsequent to the third command, the control circuit updates each selection of the selectors associated with one of the address terminal and the command terminal based on the first command that is supplied for the second time.

A8. The information processing system as A4, wherein when the first command for the second time is further issued subsequent to the second command, the control circuit updates each selection of the first and second input units connected to one of the address terminal and the command terminal based on the first command that is supplied for the second time.

A9. The information processing system as A5, wherein when the first command for the second time is further issued subsequent to the second command, the control circuit updates each selection of the selectors associated with one of the address terminal and the command terminal based on the first command that is supplied for the second time.

A10. The information processing system as A1, wherein each of the plurality of input circuits includes first and second input units connected to an associated one of the plurality of terminals, the semiconductor device further includes a control circuit that controls the first and second input units, the control circuit activates one of the first and second input units and deactivates other of the first and second input units in each of the plurality of input circuits based on the first command that is issued for a first time, and after the second command is ones issued, even if the first command is further issued for a second time, the control circuit maintains a state of the first and second input units connected to one of the clock terminal, the data terminal and the data strobe terminal as controlled by the first command that is issued for the first time.

A11. The information processing system as A10, wherein each of the plurality of input circuits further includes a selector that outputs either one of output signals of the first and second input units, the control circuit further controls the selector, the control circuit controls the selector to select the output signal supplied from activated one of the first and second input units based on the first command that is issued for the first time, and after the second command is ones issued, even if the first command is further issued for the second time, the control circuit maintains a state of selectors associated with the clock terminal, the data terminal and the data strobe terminal as controlled by the first command that is issued for the first time.

A12. The information processing system as A11, wherein even after the third command is issued subsequent to the second command, the control circuit maintains the state of the first and second input units connected to the clock terminal as controlled by the first command that is issued for the first time.

A13. The information processing system as A12, wherein even after the third command is issued subsequent to the second command, the control circuit maintains the state of the selector associated with the clock terminal as controlled by the first command that is issued for the first time.

A14. The information processing system as A10, wherein when the first command for the second time is further issued subsequent to the second command, the control circuit updates each selection of the first and second input units connected to one of the address terminal and the command terminal based on the first command that is supplied for the second time.

A15. The information processing system as A11, wherein when the first command for the second time is further issued subsequent to the third command, the control circuit updates each selection of the selectors associated with one of the address terminal and the command terminal based on the first command that is supplied for the second time.

A16. The information processing system as A12, wherein when the first command for the second time is further issued subsequent to the third command, the control circuit updates each selection of the first and second input units connected to one of the address terminal and the command terminal based on the first command that is supplied for the second time.

A17. The information processing system as A13, wherein when the first command for the second time is further issued subsequent to the second command, the control circuit updates each selection of the selectors associated with one of the address terminal and the command terminal based on the first command that is supplied for the second time.

A18. The information processing system as A1, wherein
each of the plurality of input circuits includes first and second input units connected to an associated one of the plurality of terminals and a selector that outputs either one of output signals of the first and second input units,
the semiconductor device further includes a control circuit that controls the first and second input units and the selector,
the control circuit inactivates the first input unit in an active state and activates the second input unit in an inactive state included in each of the plurality of input circuits based on the first command so that both the first and second input units are in the active state during an overlap period, and
the control circuit controls to select the selector included in each of the plurality of input circuits with reference to a completion time of the overlap period.

A19. An information processing system, comprising:
a semiconductor device that includes a reset terminal, a plurality of terminals including at least an address terminal, a command terminal, a clock terminal, a data terminal, and a data strobe terminal, and a plurality of input circuits each connected to an associated one of the plurality of terminals; and
a controller that is connected to the reset terminal and the plurality of terminals of the semiconductor device, wherein
the controller issues a reset command to the reset terminal at first timing, and then issues a second command or a third command to at least any one of the plurality of terminals at second timing subsequent to the first timing, the second command activating a write leveling circuit to perform a write leveling operation of adjusting output timing of a write data or a data strobe signal, the third command activating a DLL circuit included in the semiconductor device,
the controller issues a first command to at least any one of the plurality of terminals at third timing subsequent to the second timing, the first command specifying an operating speed of the semiconductor device,
each of the plurality of input circuits includes first and second input units connected to an associated one of the plurality of terminals,
the semiconductor device further includes a control circuit that controls the first and second input units,
the control circuit activates one of the first and second input units and deactivates other of the first and second input units in the input circuit that is connected to the clock terminal in response to the third command, and
the control circuit maintaining a state of the first and second input units connected to the clock terminal regardless of the operating speed specified by the first command.

A20. The information processing system as A19, wherein
the control circuit activates one of the first and second input units and deactivates other of the first and second input units in the plurality of input circuits connected to the clock terminal, the data terminal, and the data strobe terminal in response to the second command, and
the control circuit maintains the state of the first and second input units connected to the clock terminal, the data terminal, and the data strobe terminal regardless of the operating speed specified by the first command as controlled by the second command.

A21. The information processing system as A19, wherein the control circuit activates one of the first and second input units and deactivates other of the first and second input units in the plurality of input circuits connected to the address terminal and the command terminal, based on the operating speed specified by the first command.

A22. The information processing system as A20, wherein the control circuit activates one of the first and second input units and deactivates other of the first and second input units in the plurality of input circuits connected to the address terminal and the command terminal, based on the operating speed specified by the first command.

A23. The information processing system as A19, wherein
each of the plurality of input circuits further includes a selector that outputs either one of output signals of the first and second input units,
the control circuit further controls the selector,
the control circuit controls the selector to select the output signal supplied from activated one of the first and second input units based on the third command, and
the control circuit maintains a state of selector associated with the clock terminal as determined by the third command regardless of the operating speed specified by the first command.

A24. The information processing system as A23, wherein
when the second command is issued subsequent to the third command, the control circuit controls the selector to select the output signal supplied from activated one of the first and second input units associated with the clock terminal, the data terminal, and the data strobe terminal based on the second command, and
the control circuit maintains a state of selectors associated with the clock terminal, the data terminal, and the data strobe terminal as determined by the second command regardless of the operating speed specified by the first command.

A25. The information processing system as A23, wherein the control circuit controls the selectors to select the output signal supplied from activated one of the first and second input units associated with the address terminal and the command terminal based on the operating speed specified by the first command.

A26. The information processing system as A24, wherein the control circuit controls the selectors to select the output signal supplied from activated one of the first and second input units associated with the address terminal and the command terminal based on the operating speed specified by the first command.

What is claimed is:

1. A device comprising:
  input and output nodes;
  first and second input circuits coupled in parallel to each other between the input and output nodes, wherein the first input circuit comprises a first circuit unit coupled between the input and output nodes, the first circuit unit being configured to be activated when a first selection signal supplied thereto takes an active level and deactivated when the first selection signal takes an inactive level; and
  a control circuit configured to control the first and second input circuits such that one of the first and second input circuits is switched over from an active state to an inactive state and the other of the first and second input circuits is switched over from an inactive state to an active state during the one of the first and second input circuits being still in the active state;
  wherein the first input circuit is configured to respond to a change of a control signal from a first logic level to a second logic level and the first input circuit is configured to change the first selection signal from the active level to the inactive level after a lapse of a first period, and the first input circuit is configured to respond to a change of the control signal from the second logic level to the first logic level and change the first selection signal from the inactive level to the active level within a second period that is shorter than the first period.

2. The device as claimed in claim 1, wherein
  the second input circuit comprises a second circuit unit inserted between the first circuit unit and the output node, and the second circuit unit being configured to be activated when a second selection signal supplied thereto takes an active level and deactivated when the second selection signal takes an inactive level;
  wherein the second input circuit is configured to respond to the change of the control signal from the first logic level to the second logic level and change the second selection signal from the active level to the inactive level after a lapse of a third period, and the second input circuit is configured to respond to the change of the control signal from the second logic level to the first logic level and change the second selection signal from the inactive level to the active level after a lapse of a fourth period.

3. The device as claimed in claim 2, wherein the third period is shorter than the first period and longer than the second period.

4. The device as claimed in claim 3, wherein the third period is approximately equal to the fourth period.

5. A device comprising:
  input and output nodes;
  a first input circuit comprising:
    a first circuit unit coupled between the input and output nodes, the first circuit unit being configured to be activated when a first selection signal supplied thereto takes an active level and deactivated when the first selection signal takes an inactive level; and
    a first control circuit supplied with a control signal that changes between first and second logic levels, the first control circuit being configured to respond to a change of the control signal from the first logic level to the second logic level and change the first selection signal from the active level to the inactive level after a lapse of a first period, and the first control circuit being further configured to respond to a change of the control signal from the second logic level to the first logic level and change the first selection signal from the inactive level to the active level within a second period; and
  a second input circuit connected to the first input circuit, the second input circuit comprising:
    a second circuit unit coupled between the input and output nodes, the second circuit unit being configured to be activated when a second selection signal supplied thereto takes an active level and deactivated when the second selection signal takes an inactive level; and
    a second control circuit supplied with the control signal, the second control circuit being configured to respond to the change of the control signal from the second logic level to the first logic level and change the second selection signal from the active level to the inactive level after a lapse of a third period that is longer than the second period, and the second control circuit being further configured to respond to the change of the control signal from the first logic level to the second logic level and change the second selection signal from the inactive level to the active level within a fourth period that is shorter than the first period.

6. The device as claimed in claim 5, wherein the first control circuit comprises a first delay circuit and a first gate circuit that define the first and second periods, and
  wherein the second control circuit comprises a second delay circuit and a second gate circuit that define the third and fourth periods.

7. The device as claimed in claim 5, wherein the first period is longer than the second period and the third period is longer than the fourth period.

8. The device as claimed in claim 5, wherein the first circuit unit comprises a first transistor supplied with the first selection signal to control supply of a power voltage, and
  wherein the second circuit unit comprises a second transistor supplied with the second selection signal to control supply of the power voltage.

9. The device as claimed in claim 5, further comprising:
  a third input circuit connected with the first and second input circuits, the third input circuit comprising:
    a third circuit unit inserted between the first circuit unit and the output node, the third circuit unit being configured to be activated when a third selection signal supplied thereto takes an active level and deactivated when the third selection signal takes an inactive level; and
    a third control circuit configured to respond to the change of the control signal from the first logic level to the second logic level and change the third selection signal from the active level to the inactive level after a lapse of a fifth period that is longer than the fourth period, the third control circuit being further configured to respond to the change of the control signal from the second logic level to the first logic level and change the third selection signal from the inactive level to the active level within a sixth period; and
  a fourth input circuit connected to the first, second and third input circuits, the fourth input circuit comprising:
    a fourth circuit unit inserted between the second circuit unit and the output node, the fourth circuit unit being configured to be activated when a fourth selection signal supplied thereto takes an active level and deactivated when the fourth selection signal takes an inactive level; and
    a fourth control circuit configured to respond to the change of the control signal from the second logic level to the first logic level and change the fourth selection signal from the active level to the inactive level after a lapse of a seventh period that is longer than the second period, the fourth control circuit being further configured to respond to the change of the control signal from the first logic level to the second logic level and change the fourth selection signal from the inactive level to the active level within an eighth period.

10. The device according to claim 2, wherein the first circuit unit comprises a first transistor supplied with the first selection signal to control supply of a power voltage, and
wherein the second circuit unit comprises a second transistor supplied with the second selection signal to control supply of the power voltage.

11. The device according to claim 2, wherein the first input circuit comprises a first delay circuit and a first gate circuit that define the first and second periods, and
wherein the second input circuit comprises a second delay circuit and a second gate circuit that define the third and fourth periods.

12. The device as claimed in claim 9, wherein the first, second, third, and fourth input circuits are coupled in parallel.

13. A semiconductor device comprising:
an input node supplied with an input signal;
an output node provided correspondingly to the input node;
first and second input circuits coupled in parallel to each other between the input and output nodes; and
a control circuit configured to control the first and second input circuits such that one of the first and second input circuits is switched over from an active state to an inactive state and the other of the first and second input circuits is switched over from an inactive state to an active state during the one of the first and second input circuits being still in the active state,
wherein the first input circuit is configured to respond to a change from a first logic level to a second logic level of a control signal received from the control circuit, and the first input circuit is configured to change the first selection signal from the active level to the inactive level after a lapse of a first period, and the first input circuit is configured to respond to a change of the control signal from the second logic level to the first logic level and change the first selection signal from the inactive level to the active level within a second period that is shorter than the first period.

14. The semiconductor device as claimed in claim 13, wherein the control circuit generates a switch signal, each of the first and second input circuits includes an initial stage unit that detects a potential of the input signal, and an output unit that supplies an output signal of the initial stage unit to the internal output node,
wherein the control circuit controls the initial stage unit included in the other of the first and second input circuits being switched over from the inactive state to the active state at a first predetermined time after a transition of the switch signal,
wherein the control circuit controls the initial stage unit included in the one of the first and second input circuits being switched over from the active state to the inactive state at a second predetermined time after the transition of the switch signal, the second predetermined time being later than the first predetermined time, and
wherein the control circuit controls the output unit included in the other of the first and second input circuits being switched over from the inactive state to the active state and the output unit included in the one of the first and second input circuits being switched over from the active state to the inactive state at a third predetermined time after the transition of the switch signal, the third predetermined time being later than the first predetermined time.

15. The semiconductor device as claimed in claim 14, wherein a first command is received that specifying an operating speed of the semiconductor device from an outside, and the control circuit selects one of the first and second input circuits to be activated based on the first command.

16. The semiconductor device as claimed in claim 15, further comprising a DLL (delay-locked-loop) circuit that generates an internal clock signal based on an external clock signal, wherein the semiconductor device further receives a third command to adjust a phase of the internal clock signal, the input node includes a first input node connected to a clock terminal to which the external clock signal is supplied from the outside, and when the first command is issued, the control circuit maintains the active state of one of the first and second input circuits connected to the first input node when the third command is once issued.

17. The semiconductor device as claimed in claim 16, further comprising a write leveling circuit that adjusts an input timing of a write data and a data strobe signal with respect to the external clock signal, wherein the semiconductor device further receives a second command to activate the write leveling circuit, the input node further includes second input nodes each connected to one of a data terminal to which the write data is supplied from the outside and a data strobe terminal to which the data strobe signal is supplied from the outside, and even if the first command is issued, the control circuit maintains the active state of one of the first and second input circuits connected to the first input node and maintains the active state of one of the first and second input circuits connected to the second input node, when the second command is once issued.

18. The semiconductor device as claimed in claim 16, wherein the semiconductor device further receives an address signal and a command signal from the outside, the input node further includes third input nodes each connected to one of an address terminal to which the address signal is supplied from the outside and a command terminal to which the command signal is supplied from the outside, and even if either the second or third command is once issued, the control circuit controls one of the first and second input circuits connected to the third input nodes being switched over from an inactive state to an active state and the other of the first and second input circuits connected to the third input nodes being switched over from the active state to the inactive state based on the first command.

19. The semiconductor device as claimed in claim 13, wherein the first input circuit has an operating speed higher than that of the second input circuit, and the second input circuit has power consumption lower than that of the first input circuit, and
wherein the second input circuit is supplied with the control signal from the control circuit, the second control circuit is configured to respond to the change of the control signal from the second logic level to the first logic level and change the second selection signal from the active level to the inactive level after a lapse of a third period that is longer than the second period, and the second control circuit is configured to respond to the change of the control signal from the first logic level to the second logic level and change the second selection signal from the inactive level to the active level within a fourth period that is shorter than the first period.

* * * * *